United States Patent

Kobayashi et al.

[11] Patent Number: 5,916,729
[45] Date of Patent: *Jun. 29, 1999

[54] CHEMICALLY AMPLIFIED RESIST COMPOSITION

[75] Inventors: Eiichi Kobayashi, Yokkaichi, Japan; Makoto Murata, Bruxelles, Belgium; Toshiyuki Ota; Akira Tsuji, both of Yokkaichi, Japan

[73] Assignee: JSR Corporation, Tokyo, Japan

[*] Notice: This patent is subject to a terminal disclaimer.

[21] Appl. No.: 08/799,566

[22] Filed: Feb. 12, 1997

Related U.S. Application Data

[62] Division of application No. 08/590,677, Jan. 29, 1996, Pat. No. 5,629,135, which is a continuation of application No. 08/274,813, Jul. 14, 1994, abandoned.

[30] Foreign Application Priority Data

| Jul. 15, 1993 | [JP] | Japan | 5-197813 |
| Sep. 16, 1993 | [JP] | Japan | 5-253740 |
| Sep. 24, 1993 | [JP] | Japan | 5-261875 |

[51] Int. Cl.⁶ ............... G03F 7/016; G03C 1/54
[52] U.S. Cl. ........ 430/270.1; 430/176; 430/905
[58] Field of Search ............... 430/270.1, 191, 430/165, 192, 171

[56] References Cited

U.S. PATENT DOCUMENTS

| 4,550,069 | 10/1985 | Pampalone | 430/192 |
| 5,066,561 | 11/1991 | Pampalone | 430/165 |
| 5,143,814 | 9/1992 | Pampalone | 430/165 |
| 5,314,782 | 5/1994 | Lazarus et al. | 430/165 |
| 5,332,650 | 7/1994 | Murata et al. | 430/270.1 |
| 5,342,734 | 8/1994 | Lazarus et al. | 430/270.1 |
| 5,346,803 | 9/1994 | Crivello et al. | 430/270.1 |
| 5,397,679 | 3/1995 | Ueda et al. | 430/270.1 |
| 5,403,695 | 4/1995 | Hayase et al. | 430/192 |
| 5,556,734 | 9/1996 | Yamachika et al. | 430/270.1 |
| 5,679,495 | 10/1997 | Yamachika et al. | 430/270.1 |
| 5,731,125 | 3/1998 | Yamachika et al. | 430/270.1 |

FOREIGN PATENT DOCUMENTS

| 0 388 343 | 9/1990 | European Pat. Off. . |
| 0 425 411 | 5/1991 | European Pat. Off. . |
| 4 440 374 | 8/1991 | European Pat. Off. . |
| 0 510 670 | 10/1992 | European Pat. Off. . |
| 0 540 965 | 5/1993 | European Pat. Off. . |
| 2-113249 | 4/1990 | Japan . |
| 5-5993 | 1/1993 | Japan . |
| 5-150454 | 6/1993 | Japan . |
| 5-181277 | 7/1993 | Japan . |
| WO 92/08166 | 5/1992 | WIPO . |

OTHER PUBLICATIONS

Solid State Technology, Aug. 1991, No. 8, vol. 34, Angelo A. Lamola et al., Chemically Amplified Resists, pp. 53–60.
Derwent Publications Ltd., JP–A–5034903, Feb. 12, 1993.
G. Pawlowski, et al., Journal of Photopolymer Science and Technology, vol. 5, No. 1, pp. 55–66, "Chemical Amplification & Dissolution Inhibition: A Novel High Performance Positive Tone Deep UV Resist", 1992.

*Primary Examiner*—John S. Chu
*Attorney, Agent, or Firm*—Oblon, Spivak, McClelland, Maier & Neustadt, P. C.

[57] ABSTRACT

Positive-tone and negative-tone chemically amplified resist compositions comprising: (a-1) a blocked resin, (a-2) a combination of an alkali-soluble resin and a dissolution controlling agents, or (a-3) a combination of an alkali-soluble resin and a crosslinking agent, (b) a photoacid generator, and (c) specific kinds of solvents. The both positive-tone and negative-tone resist compositions exhibits superior sensitivity, high resolution capability, and excellent storage stability, and can be excellently applied especially to large sized substrates by spincoating for producing excellently shaped patterns by irradiation. The compositions can be used with advantage as a chemically amplified resist for the manufacture of semiconductor devices or integrated circuits (ICs).

15 Claims, No Drawings

CHEMICALLY AMPLIFIED RESIST COMPOSITION

This is a Division of application Ser. No. 08/590,677 filed on Jan. 29, 1996, now U.S. Pat. No. 5,629,135, which is a Continuation of application Ser. No.08/274,813, filed on Jul. 14, 1994, now abandoned.

BACKGROUND OF THE INVENTION

1. Field of the Invention

The present invention relates to a chemically amplified resist composition, and, more particularly, to a chemically amplified resist composition suitable for super-fine works using radiations, such as ultraviolet rays, deep ultraviolet rays, X-rays, and charged particle rays.

2. Description of the Background Art

There is an increasing demand for miniaturization of processing sizes in lithography in the fields requiring fine works such as manufacture of semiconductor devices or integrated circuits (ICs) in order to achieve high integrity in ICs. Technologies capable of processing fine works even of a size of 0.5 $\mu$m or smaller in a stable manner are required in recent years. Because of this, resists used in such a technology must have capability of forming patterns with a size smaller than 0.5 $\mu$m at a high precision. Lithographic techniques using radiations with a shorter wavelength are also being studied.

Included in such radiations are ultraviolet rays (e.g. i-line (365 nm)), deep ultraviolet rays (e.g. KrF excimer laser (248 nm)), X-rays (e.g. synchrotron radiation), and charged particle rays (e.g. electron beam). A number of resists to which these radiations can be applied have been proposed in recent years.

Among such resists, of particular interest are those of which the rate of dissolution in a developer can be changed by an acid produced by irradiation. This kind of resists is generally called "chemically amplified resists" (Chemically Amplified Resists, A. A. Lamola, et al., Lithography Materials & Processing, 53–60, 34, No. 8, (1991)).

In the manufacture of ICs using a chemically amplified resist, a resist solution is first prepared. Typically, this resist solution comprises (a) a resin protected by a group decomposable by an acid (hereinafter referred to as "acid-decomposable protective group"), which is converted into an alkali-soluble resin when the acid-decomposable protective group is decomposed (such a protected resin is more specifically defined hereinafter and referred to as "blocked resin"), (b) a compound which generates an acid by irradiation (hereinafter referred to as "photoacid generator"), and (c) a solvent which dissolves the blocked resin and the photoacid generator. This resist solution is then applied to a substrate by using a spin coater or a roll coater to form a resist coating. Adequate coatability and storage stability are thus essential characteristics for the resist solutions in order to enable sophisticated fine works to be constantly implemented. Irradiation to the resist coating produces patterns suitable for fine works. The shape of the patterns greatly affects the precision of the fine works, and a rectangular pattern is considered to be a preferred pattern.

Ethylene glycol monoethylether acetate and the like are known as solvents used for the preparation of a conventional lithographic resist solution comprising a novolak resin and a naphthoquinone diazide compound as a photosensitizer. The use of ethylene glycol monoethylether acetate as a solvent for preparing a solution of a chemically amplified resist poses a problem of storage instability. Depending on the period of time for which the resist solution prepared from this solvent has been stored, there may occur unevenness in the resist coating sensitivity, resulting in irregular patterns.

Further, along with the requirements for high integrity of ICs in recent years, substrates (silicone wafers) with a larger diameter, e.g., 4 inch, 6 inch, or even 8 inch, are employed in order to increase the yield and to promote the efficiency in the manufacture of ICs. A solution of chemically amplified resist prepared using ethylene glycol monoethylether acetate as a solvent exhibits only inadequate spin-coatability on such large diameter substrates.

An object of the present invention is therefore to provide a novel composition for chemically amplified resist which exhibits superior sensitivity and resolution capability and can be excellently applied especially to large sized substrates by spincoating.

Another object of the present invention is to provide a composition for chemically amplified resist which exhibits excellent storage stability and forms resist coating for producing excellently shaped patterns, thereby ensuring fine works to be constantly implemented.

Still another object of the present invention is to provide a composition for chemically amplified resist having superior storage stability, which can exhibit high sensitivity and produce excellently shaped patterns with good reproducibility even after storage for a long period of time.

The present inventors have undertaken extensive studies, and found that the use of specific kinds of solvents in combination with (a-1) a blocked resin, (a-2) a combination of an alkali-soluble resin and a dissolution controlling agents (hereinafter defined), or (a-3) a combination of an alkali-soluble resin and a crosslinking agent, and (b) a photoacid generator can achieve the above objects.

The present inventors have further found that the following solvents can be excellently used as said specific kinds of solvents for chemically amplified resist compositions of negative-tone type and of positive-tone type.

(1) Solvents used for negative-tone type amplified resist compositions:

(i) an ester of a saturated carboxylic acid having 1–4 carbon atoms with no substituent and an alcohol having 1–6 carbon atoms (hereinafter referred to as "ester solvent"), (ii) a mixture of ester solvent (i) and an alkyl lactate, or (iii) a mixture of an alkyl lactate, a propylene glycol alkyl ether and/or a propylene glycol alkyl ether acetate.

(2) Solvents used for positive-tone type amplified resist compositions:

(i) the ester solvent, (ii) a mixture of ester solvent (i) and an alkyl lactate, (iii) a mixture of an alkyl lactate, a propylene glycol alkyl ether and/or a propylene glycol alkyl ether acetate, or (iv) a propylene glycol alkyl ether acetate.

SUMMARY OF THE INVENTION

Accordingly, one of the specific objects of the present invention is to provide a positive-tone type chemically amplified resist composition (hereinafter referred to as "positive-tone resist composition") comprising, (A) a resin of which the acidic functional groups are protected by an acid decomposable group and which is converted into an alkali-soluble resin when the acid-decomposable protective group is decomposed (a blocked resin), (B) a compound which generates an acid by radiation (photoacid generator), and (C) a solvent selected from the group consisting of,
(i) an ester solvent,
(ii) a mixture of ester solvent (i) and an alkyl lactate,
(iii) a mixture of an alkyl lactate, a propylene glycol alkyl ether and/or a propylene glycol alkyl ether acetate, and
(iv) a propylene glycol alkyl ether acetate.

Another specific objects of the present invention is to provide a positive-tone resist composition comprising,
(A') an alkali-soluble resin,
(D) a compound which inhibits dissolution of the alkali-soluble resin in an alkali and is decomposable in the presence of an acid, and, when decomposed in the presence of an acid, exhibits an action of reducing or losing the alkali insolubility of a resin coating, or accelerating dissolution of the alkali-soluble resin in alkali (hereinafter referred to as "dissolution controlling agent"),
(B) a photoacid generator, and
(C) a solvent selected from the group consisting of said solvents (i)–(iv).

Still another specific object of the present invention is to provide a negative-tone type chemically amplified resist composition (hereinafter referred to as "negative-tone resist composition") comprising,
(A') an alkali-soluble resin,
(E) a compound which can crosslink the alkali-soluble resin in the presence of an acid (hereinafter referred to as "crosslinking agent"),
(B) a photoacid generator, and
(C) a solvent selected from the group consisting of,
(i) an ester solvent,
(ii) a mixture of ester solvent (i) and an alkyl lactate, and
(iii) a mixture of an alkyl lactate, a propylene glycol alkyl ether and/or a propylene glycol alkyl ether acetate.

These and other objects, features, and advantages of the present invention will become more apparent from the following description of the preferred embodiments.

DETAILED DESCRIPTION OF THE INVENTION AND PREFERRED EMBODIMENTS

Each component of the chemically amplified compositions of the present invention are hereinafter discussed in detail.

Alkali-soluble resins (Component (A'))

There are no specific limitations to the alkali-soluble resins used in the positive-tone resist composition or the negative-tone resist composition, so long as such resins have a functional group exhibiting affinity to an alkali developer, such as acidic functional groups (e.g. phenolic hydroxy group or carboxy group), and are soluble in an alkali developer.

Typical examples of such alkali-soluble resins are vinyl polymers containing a repeating unit formed by the cleavage of a polymerizable double bond of a monomer having at least one acidic functional group, such as hydroxystyrene, hydroxy-α-methylstyrene, vinylbenzoic acid, carboxymethylstyrene, carboxymethoxystyrene, (meth)acrylic acid, crotonic acid, maleic acid, itaconic acid, citraconic acid, mesaconic acid, or cinnamic acid, and condensed polymers containing a condensed repeating unit having an acidic functional group, typified by novolak resins.

In the case where said vinyl polymer is used as the alkali-soluble resin, although such resin may consist only of said repeating unit formed by the cleavage of a polymerizable double bond of a monomer having at least one acidic functional group, other repeating units may be contained as needed, inasmuch as the resin is soluble in an alkali developer.

Examples of such other repeating units include those formed by the cleavage of the polymerizable double bonds derived from monomers such as styrene, α-methylstyrene, vinyltoluene, maleic anhydride, (meth)acrylonitrile, crotonitrile, maleinitrile, fumaronitrile, mesaconitrile, citraconitrile, itaconitrile, (meth)acryamide, crotonamide, maleinamide, fumaroamide, mesaconamide, citraconamide, itaconamide, vinylaniline, vinylpyridien, vinyl-ε-caprolactum, vinylpyrrolidon, and vinylimidazole.

The polymerization or copolymerization reactions for manufacturing said alkali-soluble vinyl polymers can be carried out by bulk polymerization, solution polymerization, precipitation polymerization, emulsion polymerization, suspension polymerization, or bulk-suspension polymerization, in which polymerization initiators (e.g., radical polymerization initiators, anionic polymerization initiators, conjugated anionic polymerization initiators, cationic polymerization initiators) and polymerization catalysts are suitably selected depending on the kinds of monomers and reaction media.

In the case where said condensed polymer is used as the alkali-soluble resin, although it is possible that such a resin consists only of said repeating unit such as novolak resin moieties, other repeating units may be additionally contained, inasmuch as the resulting resin is soluble in an alkali developer. Such condensed polymers can be manufactured by the polycondensation or copolycondensation of at least one phenol compound and at least one aldehyde compound, optionally, together with other polycondensable compounds, in an aqueous medium or in a mixture of water and a solvent having an affinity with water in the presence of an acid catalyst.

Here, given as examples of phenol compounds are o-cresole, m-cresole, p-cresole, 2,3-xylenol, 2,4-xylenol, 2,5-xylenol, 3,4-xylenol, 3,5-xylenol, 2,3,5-trimethylphenol, and 3,4,5-trimethylphenol; and as aldehyde compounds, formaldehyde, trioxane, paraformaldehyde, benzaldehyde, acetaldehyde, propylaldehyde, and phenylacetaldehyde.

The amount of the repeating units having an acidic functional group in the alkali-soluble resin cannot be generically determined, because such an amount varies depending on the other repeating units which are optionally incorporated. Typically, this amount is 15–100 mol %, and preferably 20–100 mol %.

The polystyrene-reduced weight average molecular weight of the alkali-soluble resin measured by gel permeation chromatography (hereinafter referred to as "Mw") is preferably 1,000–150,000, and more preferably 3,000–100,000.

The alkali-soluble resins may be hydrogenated in the case where they contain repeating units having unsaturated carbon-carbon bonds. The degree of hydrogenation to saturate 70% or less, preferably 50% or less, and more preferably 40% or less, of unsaturated carbon-carbon bonds contained in such recurring units is sufficient. If the hydrogenation degree exceeds 70%, the developing characteristics may be impaired when the alkali-soluble resins are developed with an alkaline developer.

The alkali-soluble resins can be used either alone or in combination of two or more of them in the positive-tone resist composition or the negative-tone resist composition.

Blocked resin (Component (A))

The blocked resin in the present invention is the resin having acidic functional groups (e.g. phenolic hydroxy group or carboxy group) in the alkali-soluble resins blocked by one or more groups which are decomposable in the presence of an acid (acid-decomposable protective group).

The blocked resins are thus insoluble or scarcely soluble in alkali, but become alkali-soluble when the acid-decomposable protective group is decomposed by an acid generated from a photoacid generator. The term "insoluble or scarcely soluble in alkali" is defined as the characteristics of a resin, in which at least 50% (in thickness) of the coating prepared from the resin remains undissolved when developed under the same alkaline developing conditions as the conditions under which resist patterns are formed on a resist coating made from the positive-tone or negative-tone resist composition.

The acid-decomposable protective group is a group which protects or blocks the acidic functional groups, such as phenolic hydroxy group or carboxy group, and which is decomposed in the presence of an acid. There are no specific restrictions to the acid-decomposable protective groups so long as these properties are satisfied, and such groups include, for example, substituted methyl groups, 1-substituted ethyl groups, 1-branched alkyl groups, silyl groups, germyl groups, alkoxycarbonyl groups, acyl groups, and cyclic acid-decomposable protective groups.

Given as examples of said substituted methyl groups are methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, (methylthio)phenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, and piperonyl group.

Given as examples of said 1-substituted ethyl groups are 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, and α-methylphenacyl group.

Included in said 1-branched alkyl groups are, for example, isopropyl group, sec-butyl group, t-butyl group, 1,1-dimethylpropyl group, 1-methylbutyl group, and 1,1-dimethylbutyl group.

Examples of said silyl groups are trimethyl silyl group, ethyldimethyl silyl group, diethylmethyl silyl group, triethyl silyl group, dimethyl-iso-propyl silyl group, methyl-di-iso-propyl silyl group, tri-iso-propyl silyl group, t-butyldimethyl silyl group, di-t-butylmethyl silyl group, tri-t-butyl silyl group, dimethylphenyl silyl group, methyldiphenyl silyl group, and triphenyl silyl group.

Examples of said germyl groups are trimethyl germyl group, ethyldimethyl germyl group, diethylmethyl germyl group, triethyl germyl group, dimethyl-iso-propyl germyl group, methyl-di-iso-propyl germyl group, tri-iso-propyl germyl group, t-butyldimethyl germyl group, di-t-butylmethyl germyl group, tri-t-butyl germyl group, dimethylphenyl germyl group, methyldiphenyl germyl group, and triphenyl germyl group.

Given as examples of said alkoxycarbonyl groups are methoxycarbonyl group, ethoxycarbonyl group, iso-propoxycarbonyl group, t-buthoxycarbonyl group, and t-pentyloxycarbonyl group.

Further, given as examples of acyl groups are acetyl group, propionyl group, butyryl group, heptanoyl group, hexanoyl group, valeryl group, pivaloyl group, iso-valeryl group, lauryloyl group, myristoyl group, palmytoyl group, stearoyl group, oxalyl group, malonyl group, scucinyl group, glutaryl group, adipoyl group, piperoyl group, suberoyl group, azelaoyl group, sebacoyl group, acryloyl group, propioyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, iso-nicotinoyl group, toluenesulfonyl group, and mesyl group.

Given as examples of said cyclic acid-decomposable protective groups are cyclopropyl group, cyclopentyl group, cyclohexyl group, cyclohexenyl group, oxocyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 2-1,3-dioxolanyl group, 2-1,3-dithiolanyl group, benzo-2-1,3-dioxolanyl group, and benzo-2-1,3-dithiolanyl group.

Among these acid-decomposable protective groups, especially preferred are t-butyl group, benzyl group, t-butoxycarbonyl group, tetrahydropyranyl group, tetrahydrofuranyl group, tetrahydrothiopyranyl group, and tetrahydrothiofuranyl group.

The amount of the acid-decomposable protective groups to be introduced to the blocked resins (the percentage of the number of the acid-decomposable protective groups in the total number of the acidic functional groups and the acid-decomposable protective groups) is preferably 15–100%, more preferably 20–100%, and particularly preferably 20–80%.

The Mw of the blocked resin is preferably 1,000–150,000, and more preferably 3,000–100,000.

The blocked resin can be prepared, for example, by introducing at least one acid-decomposable protective group to alkali-soluble resin; by the polymerization or copolymerization of monomer containing at least one acid-decomposable protective group; or by the polycondensation or copolycondensation of polycondensable component containing at least one acid-decomposable protective group.

These blocked resins used in the positive-tone resist composition not only are made alkali-soluble themselves by an acid generated from a photoacid generator when the composition is irradiated, but also possess a characteristic of controlling the solubility of alkali-soluble resins in an in alkali solution. That is to say, these resins can suppress the solubility of alkali-soluble resins in alkali, rendering the resin coating alkali-insoluble and, when decomposed in the presence of an acid, can exhibit an action of reducing or losing the alkali-insolubility of the resin coating, or an action of accelerating dissolution of the alkali-soluble resin in an alkali. The blocked resins can thus be used also as a dissolution controlling agent (Component (D)) for the alkali-soluble resin (A') in one embodiment of the positive-tone resist composition of the present invention.

These blocked resins may be used either alone or in combination of two or more of them.

Dissolution controlling agent (Component (D))

The dissolution controlling agent which is used in combination with the alkali-soluble resin (A') in one embodiment of the positive-tone resist composition of the present invention is a compound which inhibits dissolution of the alkali-soluble resin in an alkali and is decomposable in the presence of an acid, and, when decomposed in the presence of an acid, exhibits an action of reducing or losing the alkali insolubility of a resin coating, or accelerating dissolution of the alkali-soluble resin in alkali.

Compounds having an acid-decomposable protective group substituted for acidic functional groups such as phenolic hydroxy group or carboxy group can be given as examples of the dissolution controlling agent. The above-mentioned blocked resins are also included in the dissolution controlling agents.

The dissolution controlling agent may be either a low molecular weight compound or a high molecular weight compound. Preferable dissolution controlling agents are compounds obtained by introducing said acid-decomposable protective groups to a poly-phenolic compound (e.g. bisphenol A, bisphenol F, or bisphenol S) or to a carboxylic acid compound (e.g. hydroxyphenylacetic acid).

Compounds of the following formulas (1) and (2) are examples of particularly preferable dissolution controlling agents.

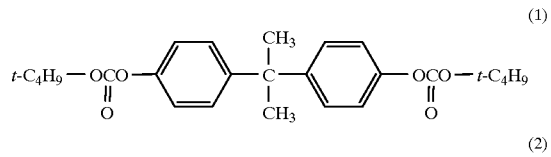

(1)

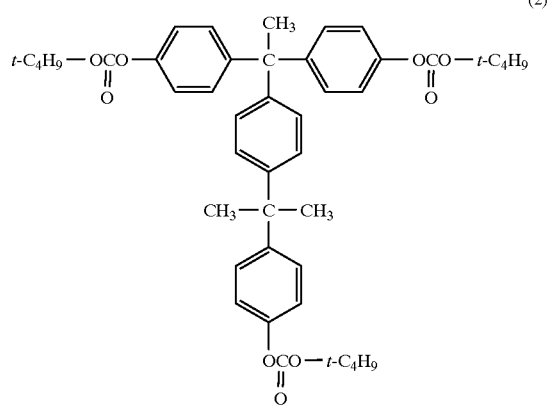

(2)

The above-described blocked resins (Component (A)) can be used as the dissolution controlling agent of a high molecular weight compound.

These low molecular weight compounds and high molecular weight compounds can be used as the dissolution controlling agent in the positive-tone resist composition either alone or in combination of two or more of them. The combination of the low molecular weight compound and the high molecular weight compound is also possible.

Crosslinking agents (Component (E))

The crosslinking agent used in the negative-tone resist composition is a compound which can crosslink alkali-soluble resins in the presence of an acid, for example, the acid generated by radiation. As an example of such a crosslinking agent, a compound having at least one substituent which exhibits crosslinking reactivity with the alkali-soluble resin can be given (such a group is hereinafter referred to as "crosslinkable substituent").

The following groups (3)–(7) are given as specific examples of the crosslinkable substituents.

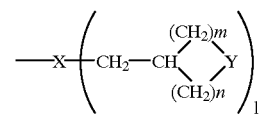

(3)

wherein l is 1 or 2; X represents, when l is 1, a single bond —O—, —S—, —CO—O—, or —NH—, and when l is 2, a trivalent N; Y is —O— or —S—; m is 0 or an integer of 1 to 3; and n is an integer of 1 to 3, provided that n+m is 4 or smaller.

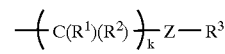

(4)

wherein k is 0 or an integer of 1 or more; Z represents —O—, —CO—O—, or —CO—; $R^1$ and $R^2$, which may be the same or different, represent a hydrogen atom or an alkyl group having 1–4 carbon atoms; and $R^3$ represents an alkyl group having 1–5 carbon atoms, an aryl group having 6–12 carbon atoms, or an aralkyl group having 7–14 carbon atoms.

$$— C(R^4) = C(R^5)(R^6)$$ (5)

wherein $R^4$, $R^5$ and $R^6$, which may be the same or different, represent a hydrogen atom or an alkyl group having 1–4 carbon atoms.

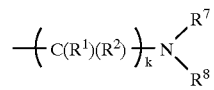

(6)

wherein k is 0 or an integer of 1 or more; $R^1$ and $R^2$, which may be the same or different, represent a hydrogen atom or an alkyl group having 1–4 carbon atoms; and $R^7$ and $R^8$ each individually represent an alkylol or an alkoxyalkyl group having 1–5 carbon atoms.

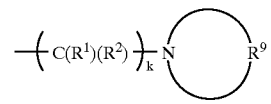

(7)

wherein k is 0 or an integer of 1 or more; $R^1$ and $R^2$, which may be the same or different, represent a hydrogen atom or an alkyl group having 1–4 carbon atoms; and $R^9$ is a divalent organic group which can form 3- to 8-membered ring containing a hetero atom selected from oxygen, sulfur and nitrogen.

Given as specific examples of these crosslinkable substituents are glycidyl ether group, glycidyl ester group, glycidyl amino group, methoxymethyl group, ethoxymethyl group, benzyloxymethyl group, diethylaminomethyl group, dimethylaminomethyl group, dimethylolaminomethyl group, diethylolaminomethyl group, morpholinomethyl group, acetoxymethyl group, benzoyloxymethyl group, formyl group, acetyl group, vinyl group, and isopropenyl group.

Specific examples of the compounds having these crosslinkable substituents are epoxy compounds of bisphenol A, epoxy compounds of bisphenol F, epoxy compounds of bisphenol S, novolak resin-type epoxy compounds, resol resin-type epoxy compounds, poly(hydroxystyrene)-type epoxy compounds, methylol group-containing melamine compounds, methylol group-containing benzoguanamine compounds, methylol group-containing urea compounds, methylol group-containing phenol compounds, alkoxyalkyl group-containing melamine compounds, alkoxyalkyl group-containing benzoguanamine compounds, alkoxyalkyl group-containing urea compounds, alkoxyalkyl group-containing phenol compounds, carboxymethyl group-containing melamine compounds, carboxymethyl group-containing benzoguanamine compounds, carboxymethyl group-containing urea compounds, and carboxymethyl group-containing phenol compounds.

Among these, methylol group-containing phenol compounds, methoxymethyl group-containing melamine compounds, methoxymethyl group-containing phenol compounds, and acetoxymethyl group-containing phenol compounds are particularly preferred, with an ideal compound being methoxymethyl group-containing melamine compounds. CYMEL 300, CYMEL 301, CYMEL 303, and CYMEL 305 (trademarks, manufactured Mitsui Cyanamid Co.) are given as examples of commercially available methoxymethyl group-containing melamine compounds. Chemical structure of the typical compound is shown by the following formula (8).

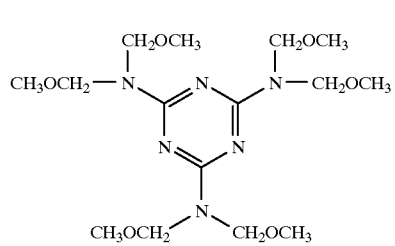

(8)

Further, the alkali-soluble resins afforded with crosslinking characteristics by introducing one of said crosslinkable substituents to acidic functional group thereof are suitable crosslinking agents. The proportion of crosslinkable substituents introduced to the alkali-soluble resin is normally 5–60 mol %, preferably 10–50 mol %, and more preferably 15–40 mol %. If this proportion is less than 5 mol %, it is difficult to effect a satisfactory crosslinking reaction, resulting in reduction in the rate of residual coatings and inducing winding or swelling of patterns; if more than 60 mol %, solubility of the alkali-soluble resin is decreased, resulting in impaired developing performances.

These crosslinking agents can be used either alone or in combination of two or more of them in the negative-tone resist composition.

Photoacid generators (Component (B))

Included in the photoacid generators, which are compounds generating an acid by irradiation, are onium salts, halogen-containing compounds, sulfones, and sulfonates. Specific examples of these compounds are as follows.

(a) Onium salts

Iodonium compounds, sulfonium compounds, phosphonium compounds, diazonium compounds, pyridium compounds, and the like are given. Of these preferred compounds are diphenyliodonium trifluoromethanesulfonate, diphenyliodonium pyrenesulfonate, diphenyliodonium dodecylbenzenesulfonate, triphenylsulfonium trifluoromethanesulfonate, triphenylsulfonium hexafluoroantimonate, triphenylsulfonium naphthalenesulfonate, (hydroxyphenyl) benzylmethylsulfonium toluenesulfonate, and the like.

(b) Halogen-containing compounds

Haloalkyl group-containing heterocyclic compounds, haloalkyl group-containing hydrocarbon compounds, and the like are given as typical examples. Preferred specific compounds include derivatives of (trichlorormethyl)-s-triazine, such as phenyl-bis(trichlorormethyl)-s-triazine, methoxyphenyl-bis(trichlorormethyl)-s-triazine, and naphtyl-bis(trichlorormethyl)-s-triazine; and 1,1-bis(4-chlorophenyl)-2,2,2-trichloroethane.

(c) Sulfone compounds

β-ketosulfone, β-sulfonylsulfone, and α-diazo compounds of these are given as typical examples. Preferred compounds are phenacylphenyl sulfone, methylphenacyl sulfone, bis(phenylsulfonyl)methane, and bis (phenylsulfonyl)diazomethane.

(d) Sulfonate compounds

Alkylsulfonates, haloalkylsulfonates, arylsulfonates, and iminosulfonates are given as examples. Preferred compounds include benzointosylate, tris-trifluoromethanesulfonate of pyrogallol, nitrobenzyl-9,10-diethoxyanthracene-2-sulfonate, and the like.

These photoacid generators may be used either alone or in combination of two or more of them.

Solvents Component (C))

The solvents used in the chemically amplified resist compositions of the present invention are as follows.

(1) For the negative-tone resist composition a solvent selected from the following groups are used.

(i) An ester of a saturated carboxylic acid having 1–4 carbon atoms with no substituent and an alcohol having 1–6 carbon atoms (ester solvent).

(ii) A mixture of ester solvent (i) and an alkyl lactate.

(iii) A mixture of an alkyl lactate, a propylene glycol alkyl ether and/or a propylene glycol alkyl ether acetate.

(2) For positive-tone resist compositions a solvent selected from the following groups are used.

(i) Said ester solvent.

(ii) A mixture of ester solvent (i) and an alkyl lactate.

(iii) A mixture of an alkyl lactate, a propylene glycol alkyl ether and/or a propylene glycol alkyl ether acetate.

(iv) A propylene glycol alkyl ether acetate.

These solvents afford excellent storage stability to the chemically amplified resist compositions. The chemically amplified resist compositions using these solvents can exhibit superior sensitivity and produce fine resist patterns even after having been stored for a long period of time.

Solvent (i)

Solvent (i) is an ester solvent prepared by condensation of a saturated carboxylic acid having 1–4 carbon atoms with no substituent and an alcohol having 1–6 carbon atoms.

Examples of the saturated carboxylic acid having 1–4 carbon atoms with no substituent include formic acid, acetic acid, propionic acid, and butyric acid. Given as examples of the alcohol having 1–6 carbon atoms are methanol, ethanol, n-propanol, iso-propanol, n-butanol, sec-butanol, tert-butanol, amyl alcohol, iso-amyl alcohol, hexanol, and cyclohexanol.

Included in the ester solvents prepared from these carboxylic acids and alcohols are methyl formate, ethyl formate, amyl formate, methyl acetate, ethyl acetate, propyl acetate, iso-propyl acetate, n-butyl acetate, iso-butyl acetate, amyl acetate, iso-amyl acetate, hexyl acetate, methyl propionate, ethyl propionate, n-butyl propionate, methyl butylate, ethyl butylate, propyl butylate, iso-propyl butylate, n-butyl butylate, iso-butyl butylate, and the like.

Of these preferred ester solvents are amyl formate, methyl acetate, ethyl acetate, n-butyl acetate, iso-butyl acetate, iso-amyl acetate, ethyl n-butylate, iso-propyl butylate, and n-butyl butylate.

Solvent (ii)

As preferable alkyl lactates which can be used mixed with said ester solvent (i), $C_1$–$C_6$ alkyl lactates, such as methyl lactate, ethyl lactate, and butyl lactate, can be given. Especially preferred is ethyl lactate.

The ester solvent and alkyl lactate are preferably incorporated at a ratio of 30–90:70–10 parts by weight in 100 parts by weight of solvent (ii).

Solvent (iii)

Solvent (iii) comprises said alkyl lactate and a propylene glycol alkyl ether and/or a propylene glycol alkyl ether acetate. Included in propylene glycol alkyl ethers which can be used here are propylene glycol monoalkyl ethers and propylene glycol dialkyl ethers.

There are two isomers for propylene glycol; 1,2-dihydroxy compound and 1,3-dihydroxy compound. Further, are there are two isomers for monoalkyl ether of 1,2-dihydroxy compound. Thus, there are three isomers for each propylene glycol monoalkyl ether. Each propylene glycol dialkyl ether also has three isomers, with the exception where the two alkyl groups are the same, in which case the number of isomers are two. All these isomers can be used as components of solvent (iii).

Lower-alkyl ethers having 1–6 carbon atoms are preferably used as the alkyl ether group for forming the propylene glycol alkyl ether. Preferred alkyl ethers are methyl ether, ethyl ether, propyl ether, butyl ether, and the like, with methyl ether and ethyl ether being particularly preferred.

Specific examples of propylene glycol alkyl ethers are propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, and propylene glycol dibutyl ether. Particularly preferred propylene glycol alkyl ethers are propylene glycol monomethyl ether, propylene glycol monoethyl ether, propylene glycol dimethyl ether, and propylene glycol diethyl ether.

In the present invention propylene glycol monoalkyl ethers and propylene glycol dialkyl ethers, including isomers and those having different alkyl ether groups, may be used either alone or in combination of two or more of them. Also, a mixture of a mono-ether compound and di-ether compound can be preferably used.

Now, illustrating propylene glycol alkyl ether acetates used as a component for solvent (iii), in the same manner as in the case of propylene glycol alkyl ethers, there are two isomers for propylene glycol, which are 1,2-dihydroxy compound and 1,3-dihydroxy compound. Further, there are two isomers for monoalkyl ether acetate of 1,2-dihydroxy compound. Thus, there are three isomers for each propylene glycol monoalkyl ether acetate.

The same lower-alkyl ethers having 1–6 carbon atoms as given for the propylene glycol alkyl ethers can be preferably used as the alkyl ether group for forming the propylene glycol alkyl ether acetates. Preferred alkyl ethers are methyl ether, ethyl ether, propyl ether, butyl ether, and the like, with methyl ether and ethyl ether being particularly preferred.

Preferred examples of propylene glycol alkyl ether acetates are lower-alkyl ($C_1$–$C_6$) ether acetates of propylene glycol, such as propylene glycol monomethyl ether acetate, propylene glycol monoethyl ether acetate, and propylene glycol monobutyl ether acetates, with propylene glycol monomethyl ether acetate being most preferred compound.

These propylene glycol monoalkyl ether acetates, irrespective of the kinds of the alkyl ether portion or the kinds of the isomers, may be used either alone or in combination of two or more of them.

For 100 parts by weight of solvent (iii), alkyl lactate is preferably contained 30–95 parts by weight, with the remaining portion being propylene glycol alkyl ether and/or propylene glycol alkyl ether acetate.

Solvent (iv)

Beside the above-described solvents (i) to (iii), propylene glycol alkyl ether acetate can be used independently for positive-tone resist compositions. All illustrations concerning the propylene glycol alkyl ether acetates in solvent (iii) above are applicable relating to the propylene glycol alkyl ether acetates of solvent (iv).

Beside the above-described solvents (i) to (iv) which are essential in the chemically amplified resist composition of the present invention, other solvents can be used to the extent of 70 parts by weight, preferably 50 parts by weight, and more preferably 30 parts by weight, in 100 parts by weight of the solvents.

Included in such other solvents which can be used are ethylene glycol monoalkyl ethers, such as ethylene glycol monomethyl ether, ethylene glycol monoethyl ether, ethylene glycol monopropyl ether, and ethylene glycol monobutyl ether; ethylene glycol monoalkyl ether acetates, such as ethylene glycol monomethyl ether acetate and ethylene glycol monoethyl ether acetate; diethylene glycol dialkyl ethers, such as diethylene glycol dimethyl ether, diethylene glycol diethyl ether, diethylene glycol dipropyl ether, and diethylene glycol dibutyl ether; aromatic hydrocarbons, such as toluene and xylene; ketones, such as methyl ethyl ketone, 2-heptanone, 3-heptanone, 4-heptanone, and cyclohexanone; esters, such as ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-ethoxypropionate, ethyl 3-methoxypropionate, 3-methoxybutylacetate, 3-methyl-3-methoxybutylacetate, 3-methyl-3-methoxybutylpropionate, 3-methyl-3-methoxybutylbutyrate, methyl acetoacetate, ethyl acetoacetate, methyl pyruvate, and ethyl pyruvate; amides, such as N-methylpyrrolidone, N,N-dimethylformamide, N-methylformamide, and N,N-dimethylacetamide.

These other solvents may be used either alone or in combination of two or more of them.

Proportions of components in the compositions

The proportions of the above-described components to be incorporated in the chemically amplified resist compositions of the present invention are as follows.

The proportion of photoacid generator incorporated in the positive-tone resist composition or the negative-tone resist composition is preferably 0.05–20 parts by weight, more preferably 0.1–15 parts by weight, and particularly preferably 0.5–10 parts by weight, for 100 parts by weight of the alkali-soluble resin and/or the blocked resin. If the proportion of the photoacid generators is less than 0.05 parts by weight, it may be difficult for the acid-catalyzed chemical reaction induced by the acid produced by irradiation to effectively take place. If it is greater than 20 parts by weight, unevenness in the coating may occur when the positive-tone resist composition or the negative-tone resist composition is applied, and there may be the occasion where scums are produced during development.

When the combination of the dissolution controlling agent and the alkali-soluble resins is used for the positive-tone resist composition, the dissolution controlling agents are incorporated preferably in an amount of 5–150 parts by weight, more preferably 5–100 parts by weight, and particularly preferably 5–50 parts by weight for 100 parts by weight of the alkali-soluble resins.

If the amount of the dissolution controlling agents is smaller than 5 parts by weight, desired effects are exhibited only with difficulty; if it is greater than 150 parts by weight, there is a tendency that coatability of the positive-tone resist composition is decreased, producing coating with poor strength.

The crosslinking agents in the negative-tone resist composition are incorporated preferably in an amount of 5–95 parts by weight, more preferably 15–85 parts by weight, and particularly preferably 20–75 parts by weight for 100 parts by weight of the alkali-soluble resins. If this proportion of the crosslinking agents is less than 5 parts by weight, it is difficult to effect a satisfactory crosslinking reaction, resulting in reduction in the rate of residual coating and inducing winding or swelling of patterns; if more than 95 parts by weight, production of scums may increase, resulting in impaired development.

The amounts of solvents used in the positive-tone resist composition or the negative-tone resist composition is normally 20–3,000 parts by weight, preferably 50–3,000 parts by weight, and more preferably 100–2,000 parts by weight, for 100 parts by weight of the total amount of alkali-soluble resins and/or the blocked resins.

Other additives

Various additives, such as surface active agents and sensitizers, can be incorporated in the chemically amplified resist composition of the present invention as needed.

Surface active agents improve coatability and promote developing performances of the chemically amplified resist. Included in such surface active agents are polyoxyethylene lauryl ether, polyoxyethylene stearyl ether, polyoxyethylene oleyl ether, polyoxyethylene octylphenyl ether, polyoxyethylene nonylphenyl ether, polyoxyethylene glycol dilaurate, and polyoxyethylene glycol distearate, as well as commercially available surfactants, such as KP341 (trademark, manufactured by Sin-etsu Chemical), Polyflow No. 75, No. 95 (trademarks, manufactured by Kyoei Oil and Fat Chemical), Efftop EF301, EF303, EF352 (trademarks, manufactured by Tokem Products), Megafack F171, F172, F173 (trademarks, manufactured by Dainippon Ink and Chemicals), Florade FC430, FC431 (trademarks, manufactured by Sumitomo 3M), Asahi Guard AG710, Surflon S-382, SC-101, SC102, SC-103, SC-104, SC-105, SC-106 (trademarks, manufactured by Asahi Glass), and the like.

The amount of the surface active agents to be incorporated is normally less than 2 parts by weight for 100 parts by weight of the chemically amplified resist composition.

Sensitizers absorb irradiated energy and transfer the absorbed energy to the photoacid generators, thereby accelerating production of an acid. Thus, the sensitizers have an effect of increasing the sensitivity of resist coating made from the chemically amplified resist composition. Preferable examples of such sensitizers are acetone, benzene, acetophenone, benzophenoene, naphthalene, biacetyl, eosine, Rosebengal, pyrenes, anthracenes, phenothiazines, and the like.

The amount of the sensitizers to be incorporated is normally less than 50 parts by weight, preferably 30 parts by weight, for 100 parts by weight of the chemically amplified resist composition.

Further, dyes or pigments may be incorporated for alleviating effects of halations during irradiation, and adhesion promoters may be added to improve adhesion properties of the resist coating to substrates.

Furthermore, other additives, such as halation inhibitors (e.g., azo compounds, amine compounds), preservatives, defoaming agents, shape improvers, and the like may be added to the chemically amplified resist composition of the present invention.

Preparation of the compositions

The chemically amplified resist composition of the present invention can be prepared by dissolving various solid components in the solvent to obtain a solution containing 5–50% by weight of solid components, filtering the solution through a filter with approximately 0.2 $\mu$m pore size.

Preparation of resist pattern

In order to prepare a resist pattern using the chemically amplified resist composition of the present invention, the composition is applied to a substrate such as a silicon wafer, aluminum-coated silicon wafer, to form a resist coating, and this resist coating is irradiated to form a desired pattern. Radiation used here is suitably selected from ultraviolet rays (e.g. i-line), deep ultraviolet rays (e.g. excimer laser), X-rays (e.g. synchrotron radiation), and charged particle rays (e.g. electron beam). Irradiation conditions such as the exposure dose of irradiation are appropriately determined depending on the kind of the chemically amplified resist composition.

When a resist pattern is prepared using the chemically amplified resist composition of the present invention, a protective coating may be provided over the resist coating in order to prevent the effects of impurities such as basic impurities contained in the working atmosphere.

Further, it is desirable for the resist coating to be baked after the irradiation in order to improve its apparent sensitivity (post-exposure bake). The heating conditions of baking is typically 30–200° C., and preferably 50–150° C., although the temperature may be varied depending on the proportion of components in the composition and kinds of additives.

Then, the resist coating is developed with an alkaline developer for forming a prescribed pattern. An alkaline solution in which an alkaline compound is dissolved to a concentration of 1–10% by weight, preferably 2–5% by weight, is used as the alkaline developer. Given as examples of alkaline compounds which can be used here are sodium hydroxide, potassium hydroxide, sodium carbonate, sodium silicate, sodium methasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrole, piperidine, 1,8-diazabicyclo-[5,4,0]-7-undecene, and 1,5-diazabicyclo-[4,3,0]-5-nonene.

Further, suitable amounts of water-soluble organic solvents, such as methanol and ethanol, and surface active agents may be added to the developer.

The developed products are normally washed with water after development using these alkaline developers.

Japanese Patent Application No. 197813/1993 filed on Jul. 15, 1993, Japanese Patent Application No. 253740/1993 filed on Sep. 16, 1993, Japanese Patent Application No. 261875/1993 filed on Sep. 24, 1993 are hereby incorporated by reference.

Other features of the invention will become apparent in the course of the following description of the exemplary embodiments which are given for illustration of the invention and are not intended to be limiting thereof.

EXAMPLES

Various characteristics of the compositions or components thereof prepared in the examples and comparative examples hereinafter are evaluated according to the following methods.

Polystyrene-reduced weight average molecular weight (Mw)

Polystyrene-reduced weight average molecular weights were measured by gel permeation chromatography using a monodispersed polystyrene as a standard, wherein GPC columns (two G2000H$_{XL}$ columns, one G3000H$_{XL}$ column, and one G4000H$_{XL}$ column, all trademarks, manufactured by Tosoh Corp.) were used under the conditions of a flow rate of 1.0 ml/minute, a column temperature of 40° C., and using tetrahydrofuran as an eluant.

Coatability

The chemically amplified resist compositions were applied by spin-coating on 6 inch silicone wafers and baked at 90° C. for 2 minutes. Resist coatings thus prepared were observed and those having no unevenness in the coating, being free from cloud and contaminants, and exhibiting high surface smoothness were rated as acceptable.

Photospeed

The exposure dose of irradiation providing 0.5 μm line-and-space patterns as designed (mJ/cm$^2$).

Coating reduction

The yield of the coating reduction was calculated by measuring the resist coating thickness before and after development using an α-step.

Synthetic Example 1
<Synthesis of Resin (A)>

Polyhydroxystyrene (30 g) was dissolved in tetrahydrofuran and 10 g of potassium t-butoxise was added to the solution. 60 g of di-t-butyl dicarbonate was added dropwise at 0° C. while stirring, and the mixture was reacted for four hours. After the reaction, the resulting solution was dropped into water. The precipitated resin was dried overnight in a vacuum drier at 50° C. The resin thus obtained had a Mw of 15,000. NMR measurement confirmed that the resin has a structure in which 29% of hydrogen atoms in phenolic hydroxy group were replaced by t-butoxycarbonyl group.

Synthetic Example 2
<Synthesis of Resin (A')>

300 g of p-t-butoxystyrene, 30 g of styrene, and 1.6 g of azobis-iso-butylonitrile were dissolved in 330 g of dioxane, and reacted for 12 hours under a nitrogen atmosphere at 70° C. After the reaction, unreacted monomers were removed to obtain a copolymer of p-hydroxystyrene and styrene. This resin was hydrolyzed with an acid to produce 180 g of a copolymer of p-hydroxystyrene and styrene with Mw of 18,000. NMR measurement confirmed that the molar ratio of p-hydroxystyrene and styrene was 85:15.

Synthetic Example 3

Bisphenol A (15 g) was dissolved in tetrahydrofuran. Di-t-butyl dicarbonate in an amount of 2 times and triethylamine in an amount of 0.3 time, respectively the total mols of hydroxy group, were added, and the mixture was reacted for 6 hours under refluxing. After the reaction, the resulting solution was dropped into water. The precipitate was dried overnight in a vacuum drier at 50° C., to obtain dissolution controlling agent (1) of the above-described formula (1).

Synthetic Example 4

A reaction was carried out in the same manner as in Synthetic Example 3 using a compound having hydrogen for the t-butoxycarbonyl group in the dissolution controlling agent of the above-described formula (2) instead of Bisphenol A in Synthetic Example 3, thus obtaining dissolution controlling agent (2) of the formula (2).

Examples 1–17 and Comparative Examples 1–10

Chemically amplified resist compositions were prepared by mixing components shown in Tables 1-1 to 1-3, and removing contaminants by filtering the mixtures through a 0.2 μm filter. These chemically amplified resist compositions were applied to 6 inch silicone wafers by spin coating and baked for 2 minutes at 100° C. Resist coating with a coating thickness of 1 μm was irradiated through a mask using a KrF excimer laser, MBK-400TL-N (trademark, manufactured by Admonscience Co.). After baking for 2 minutes at 110° C., the resist coating was developed for 60 seconds with an aqueous solution of 2.38 wt. % tetramethylammonium hydroxide at 23° C., and rinsed with water, to form resist patterns. Preparation of resist patterns were carried out two times for each chemically amplified resist composition, one immediately after the preparation of the resist composition and the other 30 days after the preparation. The results are shown in Tables 2-1 to 2-3.

Photoacid generators (B), dissolution controlling agents (D), crosslinking agents (E), and solvents (C) in Tables 1-1 to 1-3 are as follows.

Photoacid generators (B)

(1) triphenylsulfonium trifluoromethanesulfonate (2) Methoxyphenyl-bis(trichloromethyl)-s-triazine Dissolution controlling agent (D)

(1) Compound of formula (1)

(2) Compound of formula (2)

Crosslinking agent (E)

Compound of formula (8)

Solvents (C)

AF: Amyl formate

BA: Butyl acetate

ECA: Ethylene glycol monoethylether acetate

EEP: Ethyl-3-ethylpropionate

EL: Ethyl lactate (ethyl 2-hydroxypropionate)

iAA: iso-Amyl acetate iPB: iso-Propyl butyrate

PGDME: Propylene glycol dimethylether

PGEE: Propylene glycol ethylether

PGMEA: Propylene glycol methylether acetate

TABLE 1-1

| Examples | Resin | Photoacid generator (B) | Dissolution controlling agent (D) | Crosslinking agent (E) | Solvent (C) (Ratio by weight) | Ratio by weight of components |
|---|---|---|---|---|---|---|
| Negative-tone Resist | | | | | | |
| 1 | (A') | (1) | — | (8) | BA:iPB = 50:50 | (A):(B):(E):(C) = 100:3:35:400 |
| 2 | (A') | (2) | — | (8) | EL:BA:iAA = 60:20:20 | (A):(B):(E):(C) = 100:3:35:400 |
| 3 | (A') | (2) | — | (8) | EL:PGEE:PGMEA = 50:20:30 | (A):(B):(E):(C) = 100:3:35:400 |
| Positive-tone Resist | | | | | | |
| 4 | (A) | (1) | — | — | BA = 100 | (A):(B):(C) = 100:3:420 |
| 5 | (A) | (1) | — | — | EL:BA = 50:50 | (A):(B):(C) = 100:3:420 |
| 6 | (A) | (1) | — | — | EL:PGMEA = 50:50 | (A):(B):(C) = 100:3:420 |
| 7 | (A) | (1) | — | — | PGMEA = 100 | (A):(B):(C) = 100:3:420 |

TABLE 1-2

| Examples | Resin (A) | Photoacid generator (B) | Dissolution controlling agent (D) | Crosslinking agent (E) | Solvent (C) (Ratio by weight) | Ratio by weight of components |
|---|---|---|---|---|---|---|
| 8 | (A') | (2) | (1) | — | BA:AF:iAA = 50:20:30 | (A):(B):(D):(C) = 100:3:35:400 |
| 9 | (A') | (1) | (1) | — | EL:iAA = 60:40 | (A):(B):(D):(C) = 100:3:35:400 |
| 10 | (A') | (2) | (1) | — | EL:iPB = 70:30 | (A):(B):(D):(C) = 100:3:35:400 |
| 11 | (A') | (2) | (2) | — | EL:iPB = 60:40 | (A):(B):(D):(C) = 100:3:35:400 |
| 12 | (A') | (2) | (2) | — | EL:BA:AF = 50:30:20 | (A):(B):(D):(C) = 100:3:35:400 |
| 13 | (A') | (1) | (1) | — | EL:PGDME = 60:40 | (A):(B):(D):(C) = 100:3:35:400 |
| 14 | (A') | (1) | (2) | — | EL:PGEE = 60:40 | (A):(B):(D):(C) = 100:3:35:400 |
| 15 | (A') | (1) | (1) | — | PGMEA:BA = 90:10 | (A):(B):(D):(C) = 100:3:35:400 |
| 16 | (A') | (1) | (2) | — | PGMEA:EL = 90:10 | (A):(B):(D):(C) = 100:3:35:400 |
| 17 | (A') | (1) | (2) | — | PGMEA:EEP = 90:10 | (A):(B):(D):(C) = 100:3:35:400 |

TABLE 1-3

| Comparative Examples | Resin | Photoacid generator (B) | Dissolution controlling agent (D) | Crosslinking agent (E) | Solvent (C) (Ratio by weight) | Ratio by weight of components |
|---|---|---|---|---|---|---|
| Negative-tone Resist | | | | | | |
| 1 | (A') | (2) | — | (8) | EL = 100 | (A):(B):(E):(C) = 100:3:35:400 |
| 2 | (A') | (2) | — | (8) | ECA:BA = 50:50 | (A):(B):(E):(C) = 100:3:35:400 |
| 3 | (A') | (2) | — | (8) | ECA:EL = 50:50 | (A):(B):(E):(C) = 100:3:35:400 |
| Positive-tone Resist | | | | | | |
| 4 | (A) | (1) | — | — | EL = 100 | (A):(B):(C) = 100:3:420 |
| 5 | (A) | (1) | — | — | ECA = 100 | (A):(B):(C) = 100:3:420 |

TABLE 1-3-continued

| Comparative Examples | Resin | Photoacid generator (B) | Dissolution controlling agent (D) | Crosslinking agent (E) | Solvent (C) (Ratio by weight) | Ratio by weight of components |
|---|---|---|---|---|---|---|
| 6 | (A') | (1) | (1) | — | EL = 100 | (A):(B):(D):(C) = 100:3:35:400 |
| 7 | (A') | (1) | (2) | — | EL = 100 | (A):(B):(D):(C) = 100:3:35:400 |
| 8 | (A') | (1) | (1) | — | ECA = 100 | (A):(B):(D):(C) = 100:3:35:400 |
| 9 | (A') | (1) | (2) | — | ECA:PGDME = 50:50 | (A):(B):(D):(C) = 100:3:35:400 |
| 10 | (A') | (1) | (2) | — | ECA:PGEE = 50:50 | (A):(B):(D):(C) = 100:3:35:400 |

TABLE 2-1

| Examples | Coatability | Photospeed (mJ/cm$^2$) After preparation | After 30 days | Coating reduction ($\mu$m) After preparation | After 30 days |
|---|---|---|---|---|---|
| Negative-tone Resist | | | | | |
| 1 | Acceptable | 20 | 20 | 0.02 | 0.04 |
| 2 | Acceptable | 22 | 22 | 0.02 | 0.02 |
| 3 | Acceptable | 20 | 21 | 0.04 | 0.04 |
| Positive-tone Resist | | | | | |
| 4 | Acceptable | 28 | 29 | 0.04 | 0.03 |
| 5 | Acceptable | 20 | 20 | 0.03 | 0.03 |
| 6 | Acceptable | 21 | 21 | 0.02 | 0.02 |
| 7 | — | 20 | 20 | 0.02 | 0.02 |

TABLE 2-2

| Examples | Coatability | Photospeed (mJ/cm$^2$) After preparation | After 30 days | Coating reduction ($\mu$m) After preparation | After 30 days |
|---|---|---|---|---|---|
| 8 | Acceptable | 28 | 28 | 0.04 | 0.04 |
| 9 | Acceptable | 25 | 25 | 0.04 | 0.04 |
| 10 | Acceptable | 28 | 28 | 0.03 | 0.03 |
| 11 | Acceptable | 30 | 28 | 0.03 | 0.03 |
| 12 | Acceptable | 18 | 18 | 0.05 | 0.06 |
| 13 | Acceptable | 31 | 32 | 0.05 | 0.04 |
| 14 | Acceptable | 39 | 39 | 0.02 | 0.02 |
| 15 | — | 32 | 32 | 0.06 | 0.06 |
| 16 | — | 48 | 48 | 0.02 | 0.02 |
| 17 | — | 22 | 22 | 0.04 | 0.03 |

TABLE 2-3

| Comparative Examples | Coatability | Photospeed (mJ/cm$^2$) After preparation | After 30 days | Coating reduction ($\mu$m) After preparation | After 30 days |
|---|---|---|---|---|---|
| Negative-tone Resist | | | | | |
| 1 | Unacceptable | 22 | 14 | 0.04 | 0.02 |
| 2 | Unacceptable | 22 | 18 | 0.03 | 0.09 |
| 3 | Acceptable | 23 | 12 | 0.03 | 0.09 |
| Positive-tone Resist | | | | | |
| 4 | Unacceptable | 16 | 10 | 0.03 | 0.03 |
| 5 | Unacceptable | 18 | 17 | 0.05 | 0.04 |
| 6 | Unacceptable | 34 | 22 | 0.05 | 0.23 |
| 7 | Unacceptable | 46 | 34 | 0.02 | 0.08 |
| 8 | Unacceptable | 37 | 21 | 0.13 | 0.09 |

TABLE 2-3-continued

| Comparative Examples | Coatability | Photospeed (mJ/cm$^2$) | | Coating reduction ($\mu$m) | |
|---|---|---|---|---|---|
| | | After preparation | After 30 days | After preparation | After 30 days |
| 9 | Acceptable | 38 | 20 | 0.05 | 0.16 |
| 10 | Unacceptable | 43 | 31 | 0.05 | 0.14 |

As fully illustrated above, the compositions for chemically amplified resist of the present invention exhibits superior sensitivity and resolution capability and can be excellently applied especially to large sized substrates by spincoating. The compositions further exhibits excellent storage stability and is suitable as a material for forming chemically amplified resist coating for producing excellently shaped patterns. Because various radiations, such as ultraviolet rays (e.g. i-line), deep ultraviolet rays (e.g. excimer laser), X-rays (e.g synchrotron radiation), and charged particle rays (e.g. electron beam), are all applicable to the compositions, they can be used with advantage as a chemically amplified resist for the manufacture of semiconductor devices or integrated circuits (ICs) which are expected to be miniaturized in the future.

Obviously, numerous modifications and variations of the present invention are possible in light of the above teachings. It is therefore to be understood that within the scope of the appended claims, the invention may be practiced otherwise than as specifically described herein.

We claim:

1. A positive-tone type chemically amplified resist composition comprising, (A) a resin which has an acidic functional group protected by an acid decomposable group and which is converted into an alkali-soluble resin when the acid-decomposable protective group is decomposed, (B) a photoacid generator which is a compound generating an acid by irradiation selected from the group consisting of onium salts, halogen-containing compounds, and sulfone compounds, and (C) a solvent which is a mixture of an alkyl lactate with a propylene glycol alkyl ether, a propylene glycol alkyl ether acetate or both.

2. A positive-tone type chemically amplified resist composition comprising:

(A) a resin which has an acidic functional group protected by an acid decomposable group and which is converted into an alkali-soluble resin when the acid-decomposable protective group is decomposed, (B) a photoacid generator which is a compound generating an acid by irradiation, and (C) a solvent which is a mixture of an alkyl lactate with an ester of a saturated carboxylic acid having 1–4 carbon atoms with no substituent and an alcohol having 1–6 carbon atoms.

3. The positive-tone resist composition according to claim 1, wherein the amount of said acid-decomposable protective group introduced to said component (A) is 15–100% of the total number of the acidic functional groups and the acid-decomposable protective groups.

4. The positive-tone resist composition according to claim 1, wherein 0.05–20 parts by weight of component (B) and 20–3,000 parts by weight of component (C) are incorporated based on 100 parts by weight of component (A).

5. The positive-tone resist composition according to claim 2, wherein the ester of a saturated carboxylic acid having 1–4 carbon atoms with no substituent and an alcohol having 1–6 carbon atoms is selected from the group consisting of methyl formate, ethyl formate, amyl formate, methyl acetate, ethyl acetate, propyl acetate, iso-propyl acetate, n-butyl acetate, iso-butyl acetate, amyl acetate, iso-amyl acetate, hexyl acetate, methyl propionate, ethyl propionate, n-butyl propionate, methyl butyrate, ethyl butyrate, propyl butyrate, iso-propyl butyrate, n-butyl butyrate, and iso-butyl butyrate.

6. The positive-tone chemically amplified resist composition according to claim 1, wherein the alkyl lactate is at least one compound selected from the group consisting of methyl lactate, ethyl lactate, and butyl lactate.

7. The positive-tone chemically amplified resist composition according to claim 1, wherein the propylene glycol alkyl ether is at least one compound selected from the group consisting of propylene glycol monomethyl ether, propylene glycol monopropyl ether, propylene glycol monobutyl ether, propylene glycol dimethyl ether, propylene glycol diethyl ether, propylene glycol dipropyl ether, and propylene glycol dibutyl ether.

8. The positive-tone chemically amplified resist composition according to claim 1, wherein the propylene glycol alkyl ether acetate is at least one compound selected from the group consisting of propylene glycol monomethyl ether acetate, propylene glycol monoethyl ether acetate, and propylene glycol monobutyl ether acetate.

9. The positive-tone chemically amplified resist composition according to claim 1, wherein the alkyl lactate is methyl lactate.

10. The positive-tone chemically amplified resist composition according to claim 1, wherein the propylene glycol alkyl ether acetate is propylene glycol monomethyl ether acetate.

11. The positive-tone chemically amplified resist composition according to claim 2, wherein the ester of a saturated carboxylic acid having 1–4 carbon atoms with no substituent and an alcohol having 1–6 carbon atoms is n-butyl acetate or iso-butyl acetate, or a mixture thereof.

12. The positive-tone chemically amplified resist composition according to claim 2, wherein the ratio by weight of the alkyl lactate and the ester of a saturated carboxylic acid having 1–4 carbon atoms with no substituent and an alcohol having 1–6 carbon atoms is from 30:70 to 90:10.

13. A positive-tone chemically amplified resist composition comprising:

(A) a resin which has an acidic functional group protected by an acid decomposable group and which is converted into an alkali-soluble resin when the acid-decomposable protective group is decomposed, (B) a photoacid generator which is a compound generating an acid by irradiation, and (C) a solvent which is a mixture of ethyl lactate and n-butyl acetate, a mixture of ethyl lactate and iso-butyl acetate, or a mixture of ethyl lactate, n-butyl acetate and iso-butyl acetate.

14. The positive-tone chemically amplified resist composition according to claim 1, wherein said solvent is a mixture of an alkyl lactate and propylene glycol alkyl ether acetate.

15. The positive-tone chemically amplified resist composition according to claim 14, wherein for 100 parts by weight of said solvent, alkyl lactate is contained 30–95 parts by weight, with the remaining portion being propylene glycol alkyl ether acetate.

* * * * *